United States Patent [19]
Yoshimoto et al.

[11] Patent Number: 5,273,778
[45] Date of Patent: Dec. 28, 1993

[54] METHOD FOR PRODUCING GRAPHITE INTERCALATION COMPOUND

[75] Inventors: Yoshikazu Yoshimoto, Tenri; Tomonari Suzuki, Kashihara; Yoshiyuki Higashigaki, Kashiwa; Shigeo Nakajima, Nara; Toshio Inoguchi, Kashihara, all of Japan

[73] Assignee: Sharp Kabushiki Kaisha, Osaka, Japan

[21] Appl. No.: 706,006

[22] Filed: May 28, 1991

Related U.S. Application Data

[60] Continuation-in-part of Ser. No. 344,961, Apr. 28, 1989, Pat. No. 5,049,409, which is a division of Ser. No. 190,353, May 5, 1988, Pat. No. 4,946,370, which is a continuation-in-part of Ser. No. 841,188, Mar. 19, 1986, abandoned.

[30] Foreign Application Priority Data

Mar. 20, 1985 [JP] Japan .................................. 60-56478
Mar. 22, 1985 [JP] Japan .................................. 60-59275
Mar. 26, 1985 [JP] Japan .................................. 60-64572

[51] Int. Cl.$^5$ ........................ C23C 16/08; C23C 16/26
[52] U.S. Cl. .................................. 427/122; 427/249; 427/253; 427/255; 427/255.1
[58] Field of Search ............... 427/249, 253, 122, 255, 427/255.1

[56] References Cited

U.S. PATENT DOCUMENTS

| | | | |
|---|---|---|---|
| 2,901,381 | 5/1959 | Tral ........................... | 427/249 |
| 3,369,920 | 2/1968 | Bourdeau et al. ........... | 427/249 |
| 3,464,843 | 9/1969 | Basche ....................... | 427/249 |
| 3,549,847 | 12/1970 | Clark et al. ................ | 427/249 |
| 3,642,522 | 2/1972 | Gass et al. ................. | 427/249 |
| 3,677,795 | 7/1972 | Bokros et al. ............. | 427/249 |
| 3,721,577 | 3/1973 | Woerner .................... | 427/249 |
| 3,814,625 | 6/1974 | Lewin et al. .............. | 427/249 |
| 3,832,221 | 8/1974 | Ekemar ..................... | 427/249 |
| 4,237,061 | 12/1980 | Johnson ..................... | 260/429.3 |
| 4,477,374 | 10/1984 | Watanabe et al. ........ | 252/508 |
| 4,701,317 | 10/1987 | Arakawa et al. ......... | 427/249 |
| 5,021,368 | 6/1991 | Hoffman et al. ......... | 501/92 |
| 5,049,409 | 9/1991 | Yoshimoto et al. ...... | 427/122 |

FOREIGN PATENT DOCUMENTS

| | | |
|---|---|---|
| 750329 | 1/1967 | Canada . |
| 0142176 | 5/1985 | European Pat. Off. . |
| 60-238480 | 11/1985 | Japan . |
| 967565 | 8/1964 | United Kingdom . |
| 992047 | 5/1965 | United Kingdom . |

OTHER PUBLICATIONS

Patent Abstracts of Japan 58-48428 Mar. 22, 1983.
Chemical Abstracts, vol. 77, No. 24, 155692r, p. 238 Dec. 11, 1972.
Chemical Abstracts, vol. 79, No. 18, 108938g, p. 265, Nov. 5, 1973.
Chemical Abstracts, vol. 76, No. 8, 36882x, p.182, Feb. 21, 1972.
Chemical Abstracts, vol. 79, No. 18, 108939h, p. 266 Nov. 5, 1973.

*Primary Examiner*—Shrive Beck
*Assistant Examiner*—Bret Chen
*Attorney, Agent, or Firm*—Birch, Stewart, Kolasch & Birch

[57] ABSTRACT

A method for preparing graphite intercalation compounds having metal or metal compounds. The method consists of the simultaneous thermal decomposition of two kinds of starting materials by a CVD (Chemical Vapor Deposition) method in which hydrocarbon as a source material for the host graphite and other organometal reagents or metal halides for guest metal species or metal compound are decomposed simultaneously in a reactor in order to intercalate the metal species or metal compound into carbon being deposited on the substrate.

12 Claims, 1 Drawing Sheet

METHOD FOR PRODUCING GRAPHITE INTERCALATION COMPOUND

This application is a continuation-in-part of Ser. No. 07/344,961 filed on Apr. 28, 1989, now U.S. Pat. No. 5,049,409, which in turn is a divisional of application Ser. No. 07/190,353 filed on May 5, 1988, now U.S. Pat. No. 4,946,370, which in turn is a continuation-in-part of application Ser. No. 06/841,188 filed on Mar. 19, 1986, now abandoned.

FIELD OF THE INVENTION

The present invention relates to a process for preparing a graphite intercalation compound.

BACKGROUND OF THE INVENTION

The graphite has such unique properties associated with its layer structure as anisotropies in thermal and electrical conductivity. However, the synthesis of graphite is required extreme conditions of pressure and temperature due to the fact that it has inaccessible melting point and the extremely low sublimation pressure. For example, so called HOPG (Higly Oriented Pyrolitic Graphite) is prepared by decomposing a gaseous hydrocarbon (e.g. methane) at 2,000° C. and then hot pressing the resulting pyrolytic carbon at still higher temperature. It is now well known that most carbonaceous materials are well graphitized when they are subjected to a heat treatment at higher temperature above 2,500° C. On the other hand, there have been many efforts to prepare pyrolytic carbons, at the low decomposition temperature utilizing dehydrogenation, dehydrohalogenation, decarbonic acid, dehydration of selected hydrocarbons. However, the carbon deposits thus obtained are of so poorly ordered state that they are insufficient to provide anisotropic materials or device made therefrom. There also has been known carbon fiber which is obtained by the heat treatment of fibrous polymer compound at high temperature. These carbon fibers are widely used for structural materials, but their instability in physical properties debases their usefulness for new electronic materials or devices utilizing anisotropic electrical and thermal conductivity. They also lack reproducibility.

To modify graphite leads to establishment of a variety degrees of anisotropy, there have been studied many kinds of graphite intercalation compounds (GIC) which are achieved by allowing metal atoms, metal halides or acids to be inserted between adjacent graphite layers of a host graphite material.

Hitherto, many studies have been made on methods for inserting the materials to be inserted between the adjacent graphite layers. For example, a vapor-reaction method (two-bulb method), a solvent method, an electrochemical method, a mixing method, a pressure method and the like are suggested in "Carbon", published by Carbon Material Society, vol. 111, page 171 (1982). A large number of the material to be inserted are already known (Advances in Physics, 30, 139(1981), for example alkaline metals (e.g. Li, Na, K, Rb, Cs, etc.), alkaline earth metals (e.g. Ca, Sr, Ba, etc.), rare earth metals (e.g. Sm, Eu, Yb, etc.), halogen molecules, e.g. $Br_2$, $I_2$, ICl, $Cl_2$, etc.), halides (for example fluorides, e.g. $KrF_2$, $BF_3$, $PF_3$, $AlF_3$, $BrF_3$, $SiF_4$, $TiF_4$, $XeF_4$, $PF_5$, $AsF_5$, $SbF_5$, $NbF_5$, $TaF_5$, $IF_5$, $MoF_6$, $WF_6$, $UF_6$, etc.; chlorides, e.g. $MgCl_2$, $ZnCl_2$, $CdCl_2$, $HgCl_2$, $MnCl_2$, $FeCl_2$, $CoCl_2$, $NiCl_2$, $PdCl_2$, $CuCl_2$, $BCl_3$, $AlCl_3$, $GaCl_3$, $InCl_3$, $TlCl_3$, $CrCl_3$, $FeCl_3$, $RuCl_3$, $OsCl_3$, $AuCl_3$, $YCl_3$, $SmCl_3$, $EuCl_3$, $GdCl_3$, $TbCl_3$, $DyCl_3$, $HoCl_3$, $ErCl_3$, $TmCl_3$, $YbCl_3$, $LuCl_3$, $ZrCl_4$, $HfCl_4$, $SbCl_4$, $BiCl_5$, $NbCl_5$, $TCl_5$, $MoCl_5$, $UCl_5$, $TeCl_6$, $WCl_6$, etc.; bromides, e.g. $CrBr_2$, $HgBr_2$, $FeBr_2$, $AlBr_3$, $GaBr_3$, $TlBr_3$, $FeBr_3$, $AuBr_3$, $UBr_5$ etc.), oxides (e.g. $H_2O_5$, $SO_3$, $SeO_3$, $CrO_3$, $MoO_3$, $Cl_2O_7$, $Be_2O_7$, etc.), acids (e.g. $HNO_3$, $H_2SO_4$, $HClO_4$, $HF$, $CF_3COOH$ etc.) and intermetallic compounds (e.g. alkaline metal-mercury, mercury-bismuth, etc.) and the like.

However the common method such as two-zone vapor transport technique and electrochemical reaction method as well as other several novel methods, essentially achieved by direct contact of liquid or gaseous species with host graphite, was applied to such limited reagents that have low melting point or high vapor pressure. Most of these compounds with graphite elaborated by these methods are not only unstable but are also sensitive to heat. There have not been reported an air stable GIC in which intercalant is fixed firmly, nor a practical utilization of the anisotropic properties involved the new electronic device.

Inpurity doping is another method of controlling the degree of anisotropy or the type of conductivity (P-type or N-type). But the fact that graphite is themodynamically very stable refuses the diffusion technique often used in the fabrication of doped silicon or germanium semiconductor. Accordingly, doped graphite has not been reported.

SUMMARY OF THE INVENTION

The present invention is directed to a method for preparing graphite intercalation compounds with metal or metal compounds. The method consists of the simultaneous thermal decomposition of two kinds of starting materials by a CVD (Chemical Vapor Deposition) method in which hydrocarbon as a source material for the host graphite and other organometal reagents or metal halides for guest metal species or metal compound are decomposed simultaneously in a reactor in order to intercalate the metal species or metal compound into carbon being depositing on the substrate.

The method of the present invention is applicable to the preparation of the intercalation compounds into which art-known intercalants are inserted, but it is more important that the present method extends limit of intercalants which can be inserted to the graphite, i.e. the materials or compounds, which have not been applicable to the intercalation compounds, become capable to be inserted to the graphite. For example, the metals of groups Vb, IVb and IIb in the periodic table (e.g. Sb, Bi, Sn, Pb, Hg, etc.), which have not been reported as intercalants, can now be inserted to the graphite according to the present invention. The inventors tried to intercalate the metals of groups Vb, IVb and IIb in the periodic table into the graphite by the above mentioned conventional method, but failed. Accordingly, the graphite intercalation compounds with the metals of groups Vb, IVb and IIb in the periodic table are novel.

Number of intercalants has remarkably increased in recent years, because new catalysts for the two-bulb method have been found. For example, it is reported that chlorides, such as $SiCl_4$, can be intercalated for the first time by the use of chlorine gas as catalyst. It is also reported that fluorine, which is covalently bonded to the carbon atoms in the graphite and has not been intercalated, is intercalated by the use of the catalyst (e.g. $AgF$, $WF_6$ or $SbF_5$) Even when the method using the new catalysts is employed the metals of groups Vb, IVb and IIb in the periodic table have not been intercalated.

Journal of Chemical Society, Dalton Transaction, 12, 2026-2028 (1979) discloses that a graphite intercalation compound with potassium is reacted with transition metal salts in tetrahydrofuran to obtain a graphite intercalation compound into which Ti, Mn, Fe, Co, Cu or Zn is inserted. Carbon 18, 203-209 (1980) reports that a shaped mixture of lanthanoids powder and graphite is heated to form a graphite intercalation compound of the lanthanoids metals by a solid phase reaction. Journal of the American Chemical Society, 97, 3366-3373(1975) also discloses that chlorides of Fe, Co, Ni, Mn, Cu or Mo are reduced to obtain a graphite intercalation compound of the transition metal. These reports have not always been accepted in this field, but there are no descriptions that the metals of groups Vb, IVb and IIb in the periodic table can be intercalated.

According to the present invention, a graphite crystalline is grown in a gas which containing a vapor of metal to be intercalated to the graphite to form a graphite intercalation compound.

It has been also known for many years to the art that hydrocarbons and metal halides or the other metal compounds are simultaneously decomposed with heat. This method is conducted at a temperature of 1,500° to 2,000° C. to obtain carbonates. However, if it is conducted below 1,500° C., there are no prediction and theoretical explanations about what compounds are produced. For example, Japanese Kokoku Publication 39400/1974 discloses that, when a halide of silicon is introduced in the carbon accumulating process, silicon atoms are taken into the resulting graphite. Japanese Kokoku Publication 11325/1972 also discloses that, when boron trichloride is introduced, boron atoms are introduced into the graphite. However, Japanese Kokoku Publication 10566/1991 discloses that, in case of sulfur compounds, the sulfur atoms are not inserted into the graphite but form fiber. Japanese Kokai Publication 54998/1985 discloses that, in case of organic compounds of Sc, Ti, Cr, Mn, Co, Ni, Fe etc., the metal is not introduced into the graphite but form fiber. On the contrary to the above Japanese Kokoku Publication 11325/1972, J. Chem. Soc. Chem. Commun., 1758(1986) discloses that, when boron trichloride is employed, some of the carbon atoms which constitute the network of graphite are replaced with boron atoms. Accordingly, it is very difficult to predict what a product is obtained and what construction the product has, when starting materials are different from the prior art and the operation is conducted below 1,500° C.

DETAILED DESCRIPTION OF THE INVENTION

Figure 1:
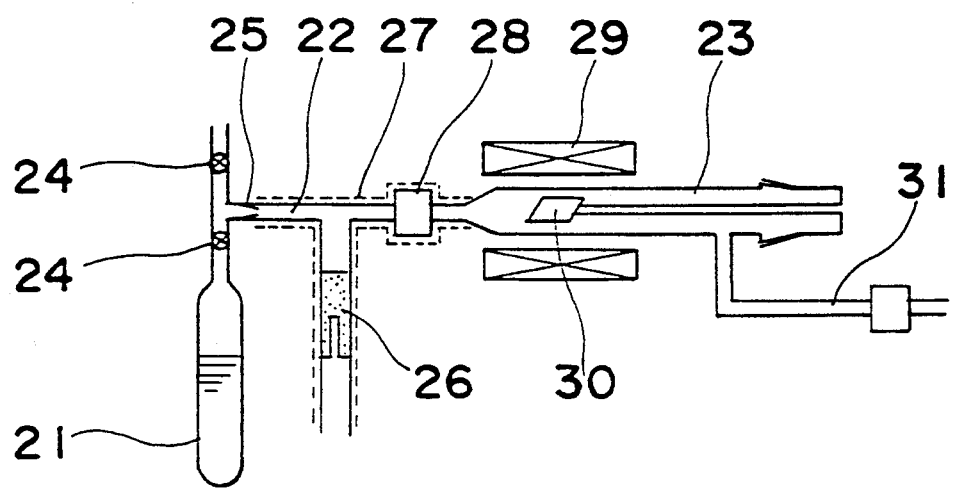
FIG. 1 shows a schematical view of the apparatus for preparing the graphite intercalation compound of the present invention.

The hydrocarbon employed in the present invention as a starting material includes aliphatic hydrocarbons, aromatic hydrocarbons and alicyclic hydrocarbons, which are generally decomposed at a temperature of less than 1,500° C., preferably 400° to 1,500° C., more preferably 800° to 1,200° C. The hydrocarbon may has a substitute group, such as a halogen atom, a hydroxyl group, a sulfonic group, a nitro group, an amino group, a carboxyl group, if necessary. Typical examples of the hydrocarbons are methane, ethane, propane, butane, pentane, hexane, cyclohexane, naphthalene, anthracene, pyrene, benzene, toluene, pyridine, allylbenzene, hexamethylbenzene, aniline, phenol, 1,2-bromoethylene, 2-butyne, acetylene, ethylene, biphenyl, diphenylacetylene, styrene, acrylonitrile, pyrrole, thiophene, dichloroethylene, derivatives thereof and the like. A method for supplying the hydrocarbon varies depending on a kind of the hydrocarbon, but includes bubbling method, vaporization method, sublimation method and the like. The supply rate of the hydrocarbon is regulated to a constant value of not more than 10 mmol/hour in order to prepare carbon films with metals. But the supply rates are not limited because they vary depending on the type of hydrocarbon. Supply rates larger than 10 mmol/hour forms soot-like carbon deposit over the substrate.

The carrier gas used to introduce the above mentioned hydrocarbon into the reaction chamber is hydrogen or an inert gas, such as argon or nitrogen. When the bubbling method for supplying the hydrocarbon is employed, hydrogen or argon is preferable for the carrier gas.

For the preparation of the graphite intercalation compounds of the present invention, organometallic compounds or metal halides are used in addition to the hydrocarbon. The organometallic compounds or halides can be any one of those which are used in this field, but preferably organic compounds or halides having a metal of groups Vb, IVb and IIb in the periodic table. Typical examples of the metals of groups Vb, IVb and IIb in the periodic table are Sb, Bi, Sn, Pb, Hg and the like. The preferred organometallic compounds are those having a metal atom of which all bonding hands are replaced by alkyl or aromatic groups, for example triphenylantimony, triphenylbismuth, tetraphenyltin, tetramethyltin, tetraethyltin, tetra-n-butyltin, tetraphyenyllead, tetra-t-butylphthalocyanatolead, diethylmercury, dimethylmercury and the like. The preferred halides are those having a metal atom of which all bonding hands are replaced with halogen atoms, for example antimony trichloride, antimony pentachloride, antimony tribromide, bismuth trichloride, tin tetrachloride, mercury monochloride, mercury dichloride, mercury dibromide and the like. These compounds are thermally decomposed in a reaction chamber to produce metal atom intercalants or metal compound molecule intercalants which form vapor in graphite growth process to make the intercalants taken into the graphite crystalline.

The substrate on which graphite film is formed is made of inorganic material (e.g. quartz, sapphire, alumina, SiC or silicon); or metal (e.g. copper, platinum, nickel or iron). Preferred is metal because of electrical conductivity. Iron group metal or alloy thereof is more preferred, because it also has catalytic function of the thermal decomposition of the hydrocarbons and of accelerating carbonization.

The conditions for forming the graphite intercalation compound of the present invention are not limited and varied depending upon the sort of the hydrocarbons and the sort of the intercalant sources, but if the hydrocarbon has a molecular weight of 100 or less and the heater is controlled to a temperature range of 400° to 1,500° C., preferably 800° to 1,200° C., one suggestion is provided as the supply rate of the intercalant sources is controlled to 0.06 to 3.0 times, preferably 0.08 to 1.5 times of that of the hydrocarbon. Conditions outside the above range make it impossible to insert the intercalants into the graphite and, even if possible, provide poor properties because the intercalant is too thin to function its superiority and is present at high concentration and causes the precipitation of the intercalant. If the hydrocarbon is supplied at a supply rate of 0.05 to 1.5 mol/hour and a molecular number density of $2 \times 10^{21}$ to $2.6 \times 10^{23}$ molecule/liter, the intercalant source is supplied at a supply rate of 0.004 to 2.3 mol/hour and a molecular number density of $1.6 \times 10^{20}$ to $4.0 \times 10^{22}$ molecule/liter.

PREFERRED EMBODIMENTS

The following embodiment illustrates the present invention, but it is not construed as limiting the present invention.

A graphite intercalation compound was deposited by using the apparatus shown in FIG. 1.

Example 1

Benzene was purified by vacuum distillation and stocked in a container 21. By opening a cock 24, the vapored benzene was introduced into a quartz reaction chamber 23 through a pyrex glass tube 22. The benzene supply was controlled by a glass capillary 25 which was equipped with the glass tube 22. The vapor of tetraphenyl tin was supplied from a container. It was admixed with the benzene vapor in the glass tube 22, and these were introduced into the reaction chamber 23 together. The glass tube 22 was wrapped with a heating tape 27 to keep its temperature constant. The glass tube 22 was connected with the quartz reaction chamber 23 with a connector 28. The reaction chamber 23 was inserted in a heater 29 and heated to a reaction temperature A single crystal substrate was placed on a holder 30 in the reaction chamber. The remainder of the vapor which had been introduced into the reaction tube 23 was drained through a drain tube 31.

Benzene whose supply rate was controlled by the capillary 25 and tetraphenyltin was introduced into the reaction chamber 23 which was kept at 900° to 1,000° C. by the heater 29. The supply rate of the mixture was kept under a few mmol/hour. The benzene molecules which had been introduced to the reaction tube 23 were thermally decomposed and formed a pyrolytic carbon which had metallic luster on the substrate. This pyrolytic carbon has graphite-like carbon layers. At the same time, tetraphenyltin was also pyrolytically decomposed to insert tin atoms between the graphite-like carbon layers. A graphite intercalation compound was formed. The obtained film of the graphite intercalation compound possessed high crystallinity under the influence of the crystallinity of the substrate and showed the high orientation at a lower temperature than the conventional method. As the supply rate of benzene and tetraphenyl tin was kept constant, the grown film of graphite intercalation compound had a uniform thickness. It provides metal gloss and mirror surface together with the high crystallinity.

It has been confirmed by observing the X-ray image of tin using an electron microscopy the tin atoms have existed uniformly in the film of the graphite. By an X-ray diffraction of the obtained film of the graphite intercalation compound, a reflection corresponding to the sum of the atomic radius of tin and distance between the graphite layers was observed in addition to the reflection of the graphite (002).

Substantially the same results were obtained by sing tetramethyltin, tetraethyltin, tetra-n-butyltin, tin tetrachloride, etc., as well as tetraphenyltin, as an organometallic compound of tin, which is used as a raw material for forming a graphite intercalation compound intercalated with tin between carbon layers.

Example 2

Graphite Intercalation compound intercalated with lead between carbon layers. Production (raw material: benzene and tetraphenyl lead)

Benzene is pyrolytically decomposed into carbon atoms, which accumulate as graphite whereas tetraphenyl lead is pyrolytically decomposed into lead atoms, which are intercalated into graphite layers.

Upon refinement through vacuum distillation, benzene is initially accommodated in a raw material receptacle 21, Upon operation of cocks 24, benzene molecules vaporized from the raw material receptacle 21 are led to a pyrex glass tube 22 and to a quartz reaction tube 23. The amount of benzene molecules to be supplied is controlled by a glass capillary 25 disposed inside the glass tube 22. The glass tube 22 is connected to a chamber 26, in which tetraphenyl lead is accommodated. Accordingly, the benzene molecules and the tetraphenyl lead are mixed with each other in the glass tube 22 and supplied to the reaction tube 23. Both the glass tube 22 and the chamber 26 are covered with and protected by a heating tape 27 and the tetraphenyl lead accommodated therein is vaporized by heating them up to a temperature of 350° C. The glass tube 22 and the reaction tube 23 are connected with each other via a pyrexquartz conversion joint 28. The reaction tube 23 is inserted into a heating furnace 29 so as to be heated up to the reaction temperature. A substrate holder 30 is disposed inside the reaction tube 23 and a single-crystalline substrate for making the carbon deposit grow up is placed on the substrate holder 30. The remaining vapor led to the reaction tube 23 is discharged outside through a discharge pipe 31.

Upon operation of the heating furnace 29, the inside of the reaction tube 23 is kept at a temperature of 1000° C. Benzene molecules, the amount of supply of which is controlled by the capillary 25, and tetraphenyl lead molecules are led into the reaction tube 23 at a constant rate below several millimols in total per an hour. The benzene molecules led into the reaction tube 23 are pyrolytically decomposed and the carbon deposit having metallic luster are formed on the single-crystalline substrate. This carbon has graphite-like structure. In this event, the tetraphenyl lead is also pyrolytically decomposed and lead atoms produced are intercalated between carbon deposit layers during the growing process of the carbon deposit. The carbon deposit obtained in this way is a graphite intercalation compound intercalated with lead atoms between graphite layers.

It has been confirmed by observing the X-ray image of lead using an electron microscopy the lead atoms have existed uniformly in the film of the graphite. By an X-ray diffraction of the obtained film of the graphite intercalation compound, a reflection corresponding to the sum of the atomic radius of lead and distance between the graphite layers was observed in addition to the reflection of the graphite (002).

Substantially the same results were obtained by using tetra-tert-butyl-phthalocyaninate lead, etc., as well as tetraphenyl lead, as an organometallic compound of lead, which is used as a raw material for forming a graphite intercalation compound intercalated with lead between graphite layers.

Example 3

Graphite Intercalation compound intercalated with bismuth between graphite layers Production (raw material: benzene and triphenyl bismuth)

Benzene is pyrolytically decomposed into carbon atoms, which accumulate as graphite whereas triphenyl bismuth is pyrolytically decomposed into bismuth atoms, which are intercalated into graphite layers.

Upon refinement through vacuum distillation, benzene is initially accommodated in a raw material receptacle 21. Upon operation of cocks 24, benzene molecules vaporized from the raw material receptacle 21 are led to a pyrex glass tube 22 and to a quartz reaction tube 23. The amount of benzene molecules to be supplied is controlled by a glass capillary 25 disposed inside the glass tube 22. The glass tube 22 is connected to a chamber 26, in which triphenyl bismuth is accommodated. Accordingly, the benzene molecules and the triphenyl bismuth are mixed with each other in the glass tube 22 and supplied to the reaction tube 23. Both the glass tube 22 and the chamber 26 are covered with and protected by a heating tape 27 and the triphenyl bismuth accommodated therein is vaporized by heating them up to a temperature of 280° C. The glass tube 22 and the reaction tube 23 are connected with each other via a pyrex-quartz conversion joint 28. The reaction tube 23 is inserted into a heating furnace 29 so as to be heated up to the reaction temperature. A substrate holder 30 is disposed inside the reaction tube 23 and a single-crystalline substrate for making the carbon deposit grow up is placed on the substrate holder 30. The remaining vapor led to the reaction tube 23 is discharged outside through a discharge pipe 31.

Upon operation of the heating furnace 29, the inside of the reaction tube 23 is kept at a temperature of 1000° C. Benzene molecules, the amount of supply of which is controlled by the capillary 25, and triphenyl bismuth molecules are led into the reaction tube 23 at a constant rate below several millimols in total per an hour. The benzene molecules led into the reaction tube 23 are pyrolytically decomposed and the carbon deposit having metallic luster are formed on the single-crystalline substrate. In this event, the triphenyl bismuth is also pyrolytically decomposed and bismuth atoms produced are intercalated between carbon deposit layers during the growing process of the carbon deposit. The carbon deposit obtained in this way is a graphite intercalation compound intercalated with bismuth atoms between graphite layers.

It has been confirmed by observing the X-ray image of bismuth using an electron microscopy the bismuth atoms have existed uniformly in the film of the graphite. By an X-ray diffraction of the obtained film of the graphite intercalation compound, a reflection corresponding to the sum of the atomic radius of bismuth and distance between the graphite layers was observed in addition to the reflection of the graphite (002).

Substantially the same results were obtained by using bismuth trichloride, etc., as well as triphenyl bismuth, as an organometallic compound of bismuth, which is used as a raw material for forming a graphite intercalation compound intercalated with bismuth between graphite layers.

Example 4

Graphite Intercalation compound intercalated with antimony between graphite layers Production (raw material: benzene and triphenyl antimony)

Benzene is pyrolytically decomposed into carbon atoms, which accumulate as graphite whereas triphenyl antimony is pyrolytically decomposed into antimony atoms, which are intercalated into graphite layers.

Upon refinement through vacuum distillation, benzene is initially accommodated in a raw material receptacle 21. Upon operation of cocks 24, benzene molecules vaporized from the raw material receptacle 21 are led to a pyrex glass tube 22 and to a quartz reaction tube 23. The amount of benzene molecules to be supplied is controlled by a glass capillary 25 disposed inside the glass tube 22. The glass tube 22 is connected to a chamber 26, in which triphenyl antimony is accommodated. Accordingly, the benzene molecules and the triphenyl antimony are mixed with each other in the glass tube 22 and supplied to the reaction tube 23. Both the glass tube 22 and the chamber 26 are covered with and protected by a heating tape 27 and the triphenyl antimony accommodated therein is vaporized by heating them up to a temperature of 250° C. The glass tube 22 and the reaction tube 23 are connected with each other via a pyrex-quartz conversion joint 28. The reaction tube 23 is inserted into a heating furnace 29 so as to be heated up to the reaction temperature. A substrate holder 30 is disposed inside the reaction tube 23 and a single-crystalline substrate for making the carbon deposit grow up is placed on the substrate holder 30. The remaining vapor led to the reaction tube 23 is discharged outside through a discharge pipe 31.

Upon operation of the heating furnace 29, the inside of the reaction tube 23 is kept at a temperature of 1000° C. Benzene molecules, the amount of supply of which is controlled by the capillary 25, and triphenyl antimony molecules are led into the reaction tube 23 at a constant rate below several millimols in total per an hour. The benzene molecules led into the reaction tube 23 are pyrolytically decomposed and the carbon deposit having metallic luster are formed on the single-crystalline substrate. In this event, the triphenyl antimony is also pyrolytically decomposed and antimony atoms produced are intercalated between carbon deposit layers during the growing process of the carbon deposit. The carbon deposit obtained in this way is a graphite intercalation compound intercalated with antimony atoms between graphite layers.

It has been confirmed by observing the X-ray image of antimony using an electron microscopy the antimony atoms have existed uniformly in the film of the graphite. By an X-ray diffraction of the obtained film of the graphite intercalation compound, a reflection corresponding to the sum of the atomic radius of antimony and distance between the graphite layers was observed in addition to the reflection of the graphite (002).

Substantially the same results were obtained by using antimony trichloride, antimony pentachloride, antimony tribromide, etc., as well as triphenyl antimony as an organometallic compound of antimony which is used as a raw material for forming a graphite intercalation compound intercalated with antimony between graphite layers.

Example 5

Graphite Intercalation compound intercalated with mercury between graphite layers Production (raw material: benzene and diethyl mercury)

Benzene is pyrolytically decomposed into carbon atoms, which accumulate as graphite whereas diethyl mercury is pyrolytically decomposed into mercury atoms, which are intercalated into graphite layers.

Upon refinement through vacuum distillation, benzene is initially accommodated in a raw material receptacle 21. Upon operation of cocks 24, benzene molecules vaporized from the raw material receptacle 21 are led to a pyre glass tube 22 and to a quartz reaction tube 23. The amount of benzene molecules to be supplied is controlled by a glass capillary 25 disposed inside the glass tube 22. The glass tube 22 is connected to a chamber 26, in which diethyl mercury is accommodated. Accordingly, the benzene molecules and the diethyl mercury are mixed with each other in the glass tube 22 and supplied to the reaction tube 23. Both the glass tube 22 and the chamber 26 are covered with and protected by a heating tape 27 and the diethyl mercury accommodated therein is vaporized by heating them up to a temperature of 150° C. The glass tube 22 and the reaction tube 23 are connected with each other via a pyrex-quartz conversion joint 28. The reaction tube 23 is inserted into a heating furnace 29 so as to be heated up to the reaction temperature. A substrate holder 30 is disposed inside the reaction tube 23 and a single-crystalline substrate for making the carbon deposit grow up is placed on the substrate holder 30. The remaining vapor led to the reaction tube 23 is discharged outside through a discharge pipe 31.

Upon operation of the heating furnace 29, the inside of the reaction tube 23 is kept at a temperature of 1000° C. Benzene molecules, the amount of supply of which is controlled by the capillary 25, and diethyl mercury molecules are led into the reaction tube 23 at a constant rate below several millimols in total per an hour. The benzene molecules led into the reaction tube 23 are pyrolytically decomposed and the carbon deposit having metallic luster are formed on the single-crystalline substrate. In this event, the diethyl mercury is also pyrolytically decomposed and mercury atoms produced are intercalated between carbon deposit layers during the growing process of the carbon deposit. The carbon deposit obtained in this way is a graphite intercalation compound intercalated with mercury atoms between graphite layers.

It has been confirmed by observing the X-ray image of mercury using an electron microscopy the mercury atoms have existed uniformly in the film of the graphite. By an X-ray diffraction of the obtained film of the graphite intercalation compound, a reflection corresponding to the sum of the atomic radius of mercury and distance between the graphite layers was observed in addition to the reflection of the graphite (002).

Substantially the same results were obtained by using diethyl mercury, mercury monochloride, mercury dichloride, mercury dibromide, etc., as well as diethyl mercury, as an organometallic compound of mercury, which is used as a raw material for forming a graphite intercalation compound intercalated with mercury between graphite layers.

What is claimed is:

1. A modified CVD method for preparing a graphite intercalation compound having a metal or metal compound intercalated between adjacent graphite layers, consisting of
   decomposing simultaneously thermally in a reactor a hydrocarbon as a source material for a host graphite and metal halide or an organometallic reagent which contains one or more metals as a source material for a guest metal or metal compound, and depositing the host graphite derived from the decomposed hydrocarbon onto a substrate, while said guest metal or metal compound derived from the decomposed organometallic reagent or metal halide, is being intercalated into the host graphite.

2. The method according to claim 1 wherein said hydrocarbon is selected from the group consisting of an aliphatic hydrocarbon, aromatic hydrocarbon and alicyclic hydrocarbon, and said organometallic reagent or metal halide are decomposed at a temperature of less than 1,500° C.

3. The method according to claim 1 wherein said hydrocarbon is selected from the group consisting of methane, ethane, propane, butane, pentane, hexane, cyclohexane, naphthalene, anthracene, pyrene, benzene, toluene, pyridine, allylbenzene, hexamethylbenzene, aniline, phenol, 1,2-bromoethylene, 2-butyne, acetylene, ethylene, biphenyl, diphenylacetylene, styrene, acrylonitrile, pyrrole, thiophene, dichloroethylene, and a mixture thereof.

4. The method according to claim 1 wherein at least one metal of said organometallic reagent or metal halide is a metal of groups Vb, IVb and IIb of the periodic table.

5. The method according to claim 4 wherein said at least one metal is Sb, Bi, Sn, Pb or Hg.

6. The method according to claim 4 wherein the metal bonds of said organometallic reagent are saturated with groups selected from alkyl or aromatic, or a mixture thereof.

7. The method according to claim 6 wherein said organometallic reagent is selected from the group consisting of triphenylantimony, triphenylbismuth, tetraphenyltin, tetramethyltin, tetraethyltin, tetra-n-butyltin, tetraphenyllead, tetra-t-butylphthalocyanatolead, diethylmercury, dimethylmercury and a mixture thereof.

8. The method according to claim 4 wherein the metal bonds of said metal halide are saturated with halogen atoms.

9. The method according to claim 8 wherein said metal halide is selected from the group consisting of antimony trichloride, antimony pentachloride, antimony tribromide, bismuth trichloride, tin tetrachloride, mercury monochloride, mercury dichloride, mercury dibromide and a mixture thereof.

10. The method according to claim 1 wherein said substrate comprises quartz, sapphire, alumina, SiC, silicon, copper, platinum, nickel or iron.

11. The method according to claim 1 wherein when the hydrocarbon has a molecular weight of 100 or less and the decomposing temperature is controlled to a temperature range of 400° to 1,500° C., the supply rate of the organometallic reagent or metal halide is controlled to 0.06 to 3.0 times that of the hydrocarbon.

12. The method according to claim 1 wherein when the hydrocarbon is supplied at a supply rate of 0.05 to 1.5 mol/hour and a molecular number density of $2 \times 10^{21}$ to $2.6 \times 10^{23}$ molecule/liter, the organometallic reagent or metal halide is supplied at a supply rate of 0.004 to 2.3 mol/hour and a molecular number density of $1.6 \times 10^{20}$ to $4.0 \times 10^{22}$ molecule/liter.

* * * * *